United States Patent
Maeno et al.

(10) Patent No.: US 6,753,611 B1
(45) Date of Patent: Jun. 22, 2004

(54) SEMICONDUCTOR DEVICE, DESIGNING METHOD THEREOF, AND RECORDING MEDIUM STORING SEMICONDUCTOR DESIGNING PROGRAM

(75) Inventors: Muneaki Maeno, Yokohama (JP); Kenji Kimura, Tokyo (JP); Toshikazu Sei, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 127 days.

(21) Appl. No.: 09/658,452

(22) Filed: Sep. 8, 2000

(30) Foreign Application Priority Data

Sep. 10, 1999 (JP) .......................................... P11-257979

(51) Int. Cl.⁷ .......................... H01L 23/48; H01L 23/52; H01L 29/40
(52) U.S. Cl. ....................................... 257/774; 257/773
(58) Field of Search ................................ 257/758, 784, 257/776, 775, 773, 774

(56) References Cited

U.S. PATENT DOCUMENTS

| | | | | |
|---|---|---|---|---|
| 5,014,110 A | * | 5/1991 | Satoh | |
| 5,049,969 A | * | 9/1991 | Orbach et al. | |
| 5,289,037 A | * | 2/1994 | Savignac et al. | |
| 5,506,450 A | * | 4/1996 | Lee et al. | |
| 5,620,916 A | | 4/1997 | Eden et al. | |
| 5,861,673 A | | 1/1999 | Yoo et al. | |
| 6,081,036 A | * | 6/2000 | Hirano et al. | |
| RE36,837 E | * | 8/2000 | Kohyama | |
| 6,262,487 B1 | * | 7/2001 | Igrashi et al. | |
| 6,303,990 B1 | * | 10/2001 | Weber | |
| 6,373,134 B1 | * | 4/2002 | Watanabe | |

FOREIGN PATENT DOCUMENTS

| | | |
|---|---|---|
| JP | 5-226331 | 9/1993 |
| JP | 10-189600 | 7/1998 |
| TW | 363256 | 7/1999 |

* cited by examiner

*Primary Examiner*—Sheila V. Clark
(74) *Attorney, Agent, or Firm*—Finnegan, Henderson, Farabow, Garrett & Dunner, L.L.P.

(57) ABSTRACT

A semiconductor device has a via-contact, a main wire having an end connected to the via-contact, and an extension extended in line with the main wire from the end of the main wire beyond the via-contact, the width of the extension being equal to or narrower than the width of the main wire. The extension prevents the end of the main wire from being rounded by an optical proximity effect, eliminates a contact defect or an open defect between the via-contact and the end of the main wire, and involves no widening of the main wire around the via-contact, so that other via-contacts may be arranged in the vicinity of the via-contact in question without violating design rules.

2 Claims, 12 Drawing Sheets

SEMICONDUCTOR DEVICE, DESIGNING METHOD THEREOF, AND RECORDING MEDIUM STORING SEMICONDUCTOR DESIGNING PROGRAM

BACKGROUND OF THE INVENTION

1. Field of the Invention

The present invention relates to semiconductor devices, a method of designing semiconductor devices, and recording media for storing semiconductor designing programs. In particular; the present invention relates to semiconductor devices having multilayer wiring structures, and a technique of designing a highly integrated semiconductor device having fine metal wires connected through via-contacts provided with extensions.

2. Description of the Related Art

Fine technology for semiconductor devices is rapidly improving to provide very small circuit patterns. The very small circuit patterns have a problem.

The problem is an optical proximity effect that occurs during a lithography process even if masks or steppers for producing circuit patterns are precise. The optical proximity effect rounds an end of a metal wire. If the rounded wire end is connected to a via-contact it reduces or eliminates a contact area between the wire end and the via-contact, to increases contact resistance between the wire and the via-contact and cause an open defect.

Figure 1:
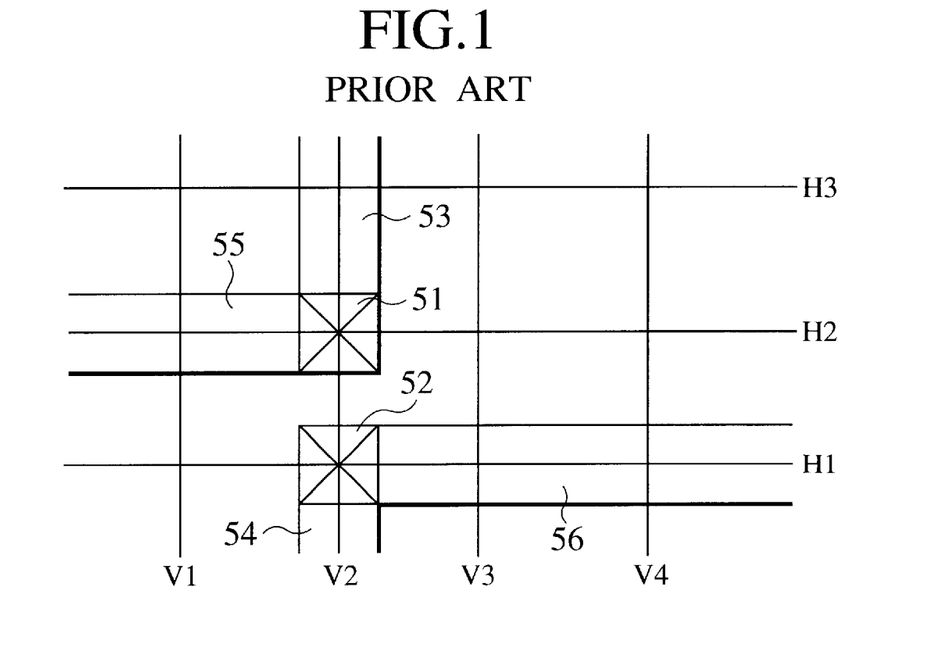
FIG. 1 is a plan view showing a pattern of metal wires designed according to a prior art.
Figure 2:
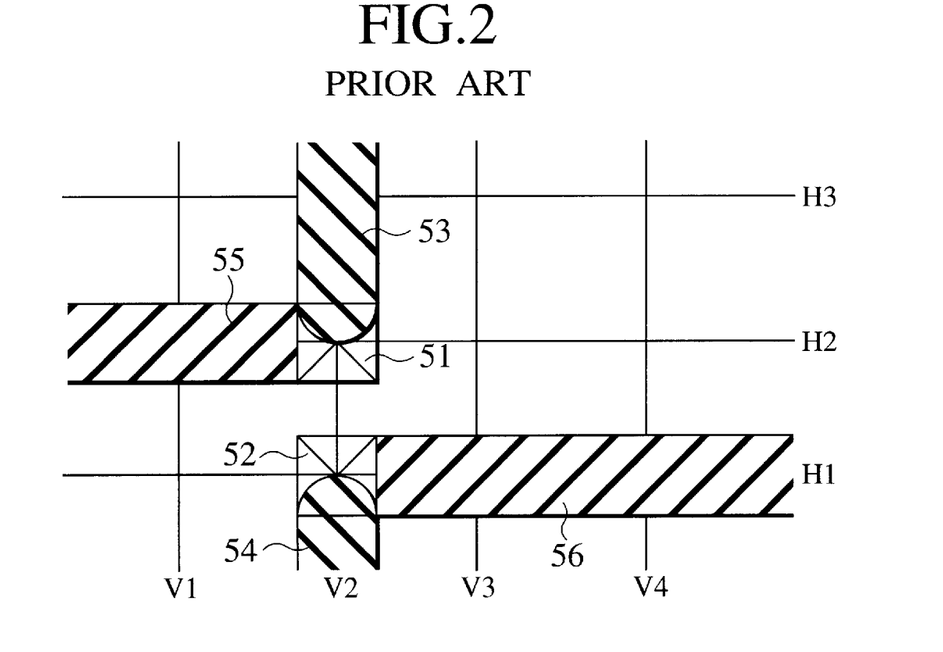
FIG. 2 is a plan view showing a pattern of metal wires manufactured according to the pattern of FIG. 1.
Figure 3:
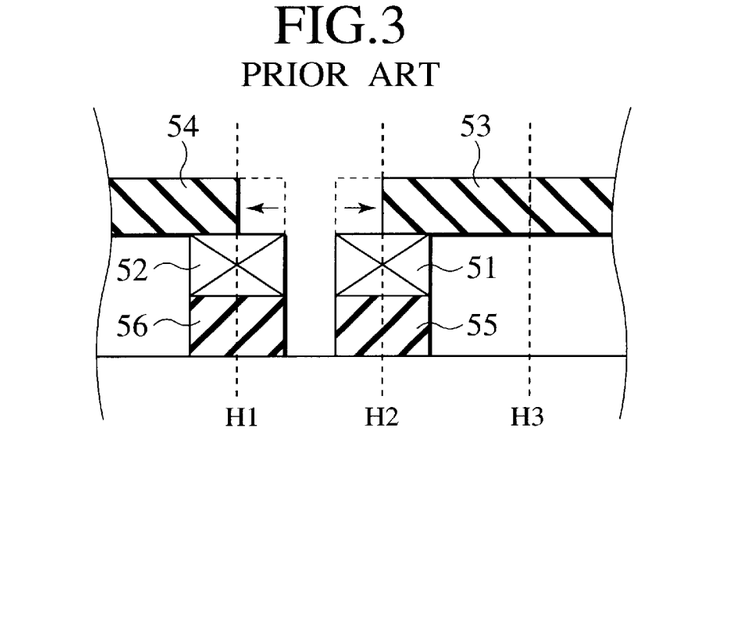
FIG. 3 is a sectional view taken along a grid line V2 of FIG. 2.

FIG. 1 is a plan view showing a pattern of metal wires designed according to a prior art. Wires 53 and 54 are in an upper layer and are connected to via-contacts 51 and 52, respectively. The via-contacts 51 and 52 are connected to wires 55 and 56 that are in a lower layer. FIG. 2 is a plan view showing metal wires manufactured according to the design of FIG. 1. FIG. 3 is a sectional view taken along a grid line V2 of FIG. 2. In FIGS. 1 and 2, the distance between adjacent grid lines indicates a minimum distance by which adjacent metal wires in each layer must be separated from each other. In FIG. 1, an end of each wire is square and is in contact with the whole surface of a via-contact A mask formed according to the design of FIG. 1 also has a square shape for each wire end. During a lithography process, however, the optical proximity effect rounds each end of the wires 53 and 54 as shown in FIG. 2. The optical proximity effect may make the ends of the wires 53 and 54 recede in the arrow directions of FIG. 3, to reduce contact areas between the wires 53 and 54 and the via-contacts 51 and 52. In FIG. 3, dotted lines indicate designed ends of the wires 53 and 54.

Figure 4:
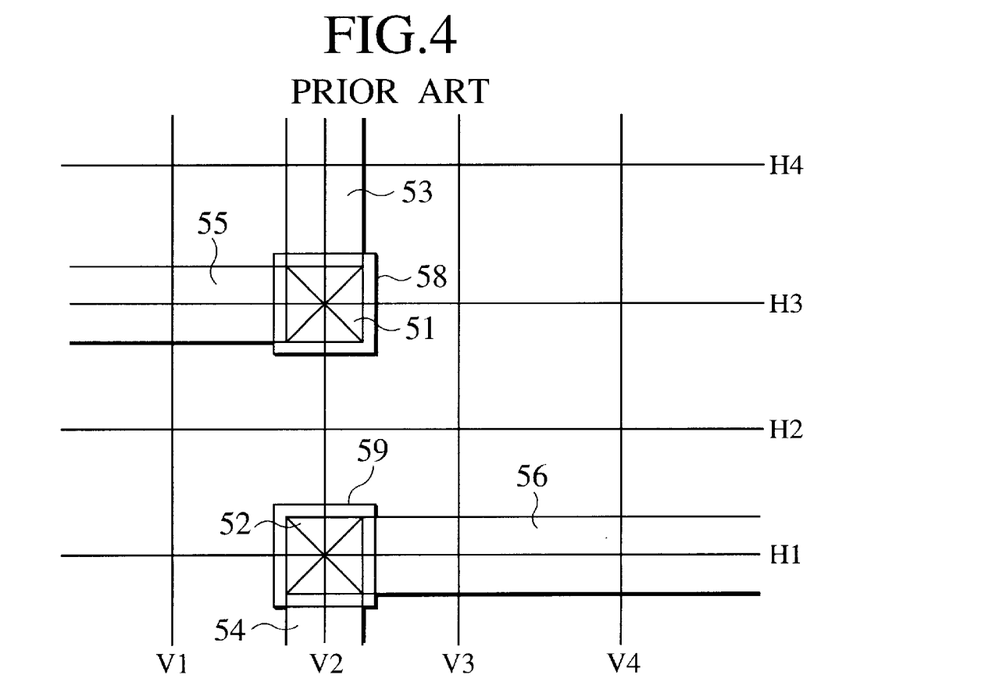
FIG. 4 is a plan view showing metal wires and via-contacts with supplementary fringes according to a prior art.

There is an OPC (optical proximity correction) technique to increase a contact area between a metal wire end and a via-contact. This technique corrects wire ends when preparing data to make a mask. For example, this technique provides a wire end with a supplementary fringe that extends in every direction around a via-contact. FIG. 4 shows a pattern of metal wires having supplementary fringes 58 and 59 to cover via-contacts 51 and 52 according to a prior art The pattern of FIG. 4 is useful to form metal wires having no round ends and having proper contact areas between the wire ends and via-contacts.

The supplementary fringes 58 and 59, however, increase the width of each wire at each via-contact greater than the width of the other part of the wire. It is necessary therefore, to separate the adjacent via-contacts 51 and 52 from each other with a grid line H2 interposing between them. In addition, other wires or via-contacts must not be arranged on grid lines that are adjacent to the via-contacts 51 and 52, or the intervals of grid lines must be increase to accommodate the supplementary fringes 58 and 59. These conditions deteriorate the integration of metal wires in a semiconductor device.

The supplementary fringes also increase the quantity of design data, extend a mask data preparation time, and elongate a semiconductor device development time.

SUMMARY OF THE INVENTION

An object of the present invention is to provide a semiconductor device that is highly integrated and minimizes contact defects between metal wires and via-contacts, a method of designing such a semiconductor device, and a recording medium storing a program for designing such a semiconductor device.

Another object of the present invention is to provide a semiconductor device involving a short development time, a method of designing such a semiconductor device, and a recording medium storing a program for designing such a semiconductor device.

In order to accomplish the objects, a first aspect of the present invention provides a semiconductor device having a via-contact, a main wire having an end connected to the via-contact, and an extension extended in line with the main wire from the end of the main wire beyond the via-contact, the width of the extension being equal to or narrower than the width of the main wire.

The "via-contact" is a conductive plug formed in an intermediate layer between wiring layers in a semiconductor device of multilayer wiring structure, to electrically connect metal wires of the upper and lower wiring layers to each other. The via-contact may have any plan shape, such as a quadrate or a circle. The "main wire" is a metal wire to electrically connect functional blocks, elements, or external terminals on a semiconductor chip. The "extension" is a metal wire extended from an end of the main wire and electrically connected thereto. It is preferable that the extension is equal to the main wire in materials, manufacturing methods, and manufacturing processes. The extension extends in line with the main wire, i.e., in the length direction of the main wire and runs over the via-contact, unlike the supplementary fringe of the prior art that extends in all directions around a via-contact The extension may have any plan shape, such as a quadrate or a circle.

According to the first aspect, the extension is extended in line with the main wire from an end of the main wire beyond the via-contact with the width of the extension being equal to or narrower than the width of the main wire. The optical proximity effect rounds only an end of the extension, and therefore, the end of the main wire is intact and is properly connected to the via-contact without bulging around the via-contact As a result, other main wires or via-contacts may be arranged on grid lines or on grid intersections in the vicinity of the via-contact in question without violating design rules. This realizes a highly integrated layout for a semiconductor device with densely arranged wires and via-contacts.

A second aspect of the present invention provides a semiconductor device having a via-contact, a main wire having an end connected to the via-contact, and an extension orthogonally extended from the end of the main wire beyond the via-contact, the width of the extension being equal to or narrower than the width of the main wire.

According to the second aspect, the extension is orthogonally extended from an end of the main wire beyond the via-contact with the width of the extension being equal to or narrower than the width of the main wire. The optical proximity effect rounds only ends of the extension, and therefore, the end of the main wire is intact and is properly connected to the via-contact A third aspect of the present invention provides a method of designing a semiconductor device having X wiring layers. The method includes the steps of arranging functional blocks and elements in a chip area with the use of an automatic layout tool, and arranging main wires in a layer N, main wires in a layer N+1, and via-contacts in the layer N with the use of the automatic layout tool, to connect the functional blocks and elements to one another through the main wires and via-contacts. The via-contacts in the layer N include:

(1) the via-contacts themselves to electrically connect the main wires in the layer N to the main wires in the layer N+1;

(2) an extension formed in the layer N+1 on and beyond each of the via-contacts and extended from an end of a corresponding one of the main wires of the layer N+1 in line with the main wire, the width of the extension being equal to or narrower than the width of the main wire; and (3) an extension formed in the layer N under and beyond each of the via-contacts and extended from an end of a corresponding one of the main wires of the layer N in line with the main wire, the width of the extension being equal to or narrower than the width of the main wire.

Here, X is a natural number and N is a natural number satisfying 0<=N<=X-1. If N=0 then a wiring layer N is a substrate, and a wiring layer N+1 is a first wiring layer. It is preferable that all via-contacts in the wiring layers have the same characteristics as those mentioned above. Even if a designer provides the via-contacts of the above characteristics only for specific wiring layers of a semiconductor device, the effect of the present invention will be demonstrated in the semiconductor device. "In line with" means that the extension has placed for wiring direction only in 0 degree direction and 180 degree direction.

According to the third aspect, each via-contact has extensions each connected to an end of a main wire. The optical proximity effect rounds only the extensions, and therefore, the end of each main wire is intact and is properly connected to the via-contact. An end of each main wire is not widened around a via-contact, so that other main wires or via-contacts may be arranged on grid lines or on grid intersections in the vicinity of the via-contact in question without violating design rules. This realizes a highly integrated layout for a semiconductor device with densely arranged wires and via-contacts. Data for via-contacts entered into an automatic layout tool may include data for the extensions, so that there is no necessity to provide a main wire with the extension as a supplementary fringe when preparing data to make a mask. This decreases the quantity of design pattern data, shortens a mask data preparation time, and reduces a semiconductor device development time.

A fourth aspect of the present invention provides a method of designing a semiconductor device having X wiring layers. The method includes the steps of arranging functional blocks and elements in a chip area with the use of an automatic layout tool, and arranging main wires in a layer N, main wires in a layer N+1, and via-contacts in the layer N with the use of the automatic layout tool, to connect the functional blocks and elements to one another through the main wires and via-contacts. The via-contacts in the layer N include:

(1) the via-contacts themselves to electrically connect the main wires in the layer N to the main wires in the layer N+1;

(2) an extension formed in the layer N+1 on and beyond each of the via-contacts in contact with an end of a corresponding one of the main wires of the layer N+1 and extended orthogonally to the main wire, the width of the extension being equal to or narrower than the width of the main wire; and (3) an extension formed in the layer N under and beyond each of the via-contacts in contact with an end of a corresponding one of the main wires of the layer N and extended orthogonally to the main wire, the width of the extension being equal to or narrower than the width of the main wire. "Orthogonally to" means that the extension has placed for wiring direction only in 90 degree direction and 270 degree direction.

According to the fourth aspect, each via-contact has extensions each connected to an end of a main wire. The optical proximity effect rounds only the extensions, and therefore, the end of each main wire is intact and is properly connected to the via-contact. Data for via-contacts entered into an automatic layout tool may include data for the extensions, so that there is no necessity to provide a main wire with the extension as a supplementary fringe when preparing data to make a mask. This decreases the quantity of design pattern data, shortens a mask data preparation time, and reduces a semiconductor device development time.

A fifth aspect of the present invention provides a recording medium for storing a program that is used to design a semiconductor device having X wiring layers. The program includes the steps of arranging functional blocks and elements in a chip area with the use of an automatic layout tool, and arranging main wires in a layer N, main wires in a layer N+1, and via-contacts in the layer N with the use of the automatic layout tool, to connect the functional blocks and elements to one another through the main wires and via-contacts. The via-contacts in the layer N include:

(1) the via-contacts themselves to electrically connect the main wires in the layer N to the main wires in the layer N+1;

(2) an extension formed in the layer N+1 on and beyond each of the via-contacts and extended from an end of a corresponding one of the main wires of the layer N+1 in line with the main wire, the width of the extension being equal to or narrower than the width of the main wire; and (3) an extension formed in the layer N under and beyond each of the via-contacts and extended from an end of a corresponding one of the main wires of the layer N in line with the main wire, the width of the extension being equal to or narrower than the width of the main wire.

A sixth aspect of the present invention provides a recording medium for storing a program that is used to design a semiconductor device having X wiring layers. The program includes the steps of arranging functional blocks and elements on a chip with the use of an automatic layout tool, and arranging main wires in a layer N, main wires in a layer N+1 , and via-contacts in the layer N with the use of the automatic layout tool to connect the functional blocks and elements to one another through the main wires and via-contacts. The via-contacts in the layer N include:

(1) the via-contacts themselves to electrically connect the main wires in the layer N to the main wires in the layer N+1, (2) an extension formed in the layer N+1 on and beyond each of the via-contacts in contact with an end of a corresponding one of the main wires of the layer N+1 and extended orthogonally to the main wire, the width of the extension being equal to or narrower than the width of the main wire; and (3) an extension formed in the layer N under and beyond each of the via-contacts in contact with an end of a corresponding one of the main wires of the layer N and extended orthogonally to the main wire, the width of the extension being equal to or narrower than the width of the main wire.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DESCRIPTION OF THE PREFERRED EMBODIMENT

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First embodiment

Figure 5:
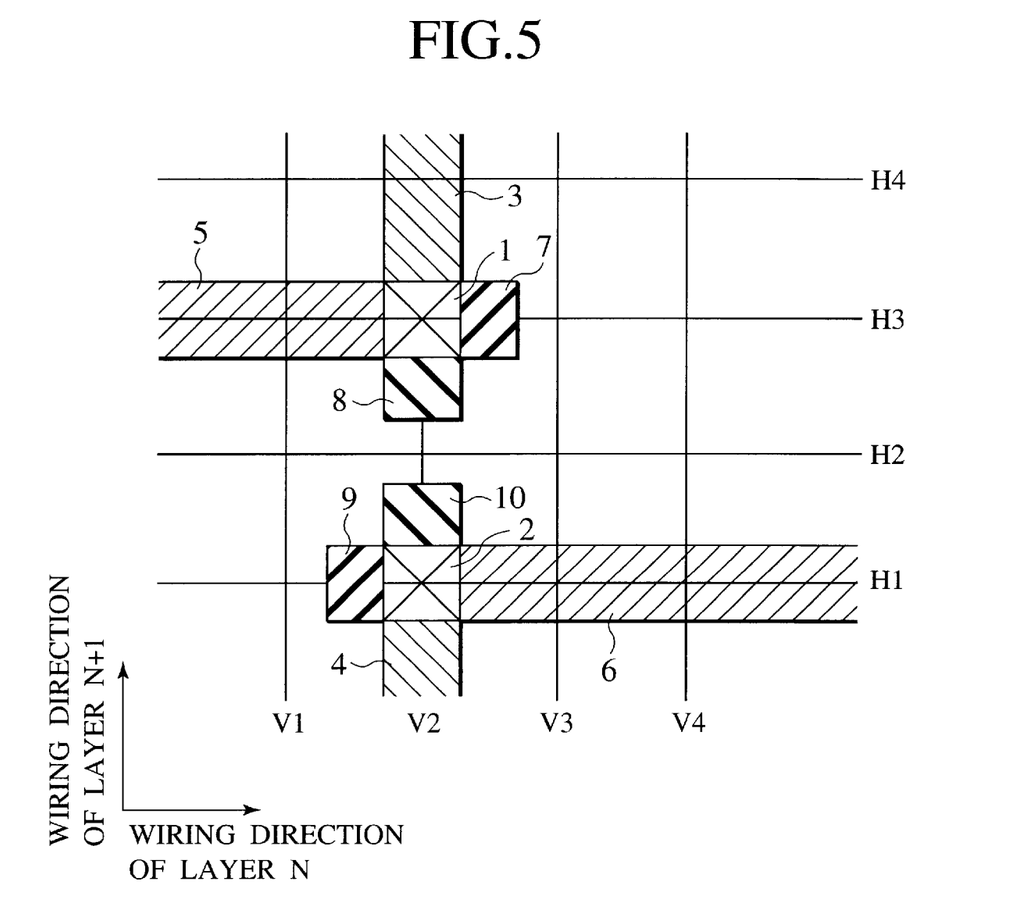
FIG. 5 is a plan view showing metal wires of a semiconductor device according to a first embodiment of the present invention.

FIG. 5 is plan view showing metal wires of a semiconductor device according to the first embodiment of the present invention. The semiconductor device has via-contacts 1 and 2, main wires 3 to 6, and extensions 7 to 10. An end of each main wire is connected to a corresponding via-contact Each extension is in line with a corresponding main wire, is connected to an end of the main wire, and is extended beyond the via-contact to which the main wire is connected. The width of each extension is equal to or narrower than the width of the corresponding main wire.

Via-contacts are conductive plugs formed in an intermediate layer between wiring layers in semiconductor device of multilayer wiring structure, to electrically connect metal wires formed on the upper and lower wiring layers to each other. In FIG. 5, the via-contacts 1 and 2 are arranged on a grid that is used for a designing purpose. The distance between adjacent grid lines indicates a minimum distance by which adjacent metal wires in each layer must be separated from each other.

In FIG. 5, the grid includes vertical grid lines V1 to V4 and horizontal grid lines H1 to H4. The via-contact 1 is arranged on a grid intersection V2–H3, and the via-contact 2 on a grid intersection V2-H1.

Although the width of each via-contact in FIG. 5 is equal to the width of a corresponding wire, it may be narrower than the wire width. Although each via-contact in FIG. 5 has a quadrate plan shape, it may have any other plan shape.

The main wires 3 to 6 are metal wires for electrically connecting functional blocks or elements of the semiconductor device to each other to transmit signals or power among them. The main wire 3 is in a layer N+1 and is connected to the main wire 5, which is in a layer N, through the via-contact 1 that is in the layer N. The main wire 4 is in the layer N+1 and is connected to the main wire 6, which is in the layer N, though the via-contact 2 that is in the layer N. The via-contacts 1 and 2 are in contact with the ends of the main wires 3 to 6. The main wires 3 to 6 are arranged on grid lines. According to the first embodiment, the semiconductor device consists of X wiring layers where "X" is a natural number and "N" is any natural number that satisfies 0<=N<=X–1. If N=0 then a layer N is a substrate, and a layer N+1 is a first layer. Via-contacts that connect the wires of a layer N to the wires of a layer N+1 are in the layer N.

The extensions 7 to 10 are metal wires that may be rounded by the optical proximity effect so that the ends of the main wires 3 to 6 are intact The extensions 7 to 10 are electrically connected to the corresponding main wires. It is preferable that the extensions 7 to 10 are equal to the main wires 3 to 6 in materials, manufacturing methods, and manufacturing processes. Each extension runs in line with the corresponding main wire beyond the corresponding via-contact, unlike the supplementary fringe of the prior art that spreads around a via-contact. Although the plan shape of each extension in FIG. 5 is quadrate, it may have any other shape such as a circle.

The extension 8 is in the layer N+1 and is extended from the end of the main wire 3. The extension 10 is in the layer N+1 and is extended from the end of the main wire 4. The extension 7 is in the layer N and is extended from the end of the main wire 5. The extension 9 is in the layer N and is extended from the end of the main wire 6. Although each end of the main wires is on a via-contact in FIG. 5, this does not limit the present invention. The main wires may have via-contacts in the middle thereof. Such middle via-contacts may have no extensions.

Figure 6:
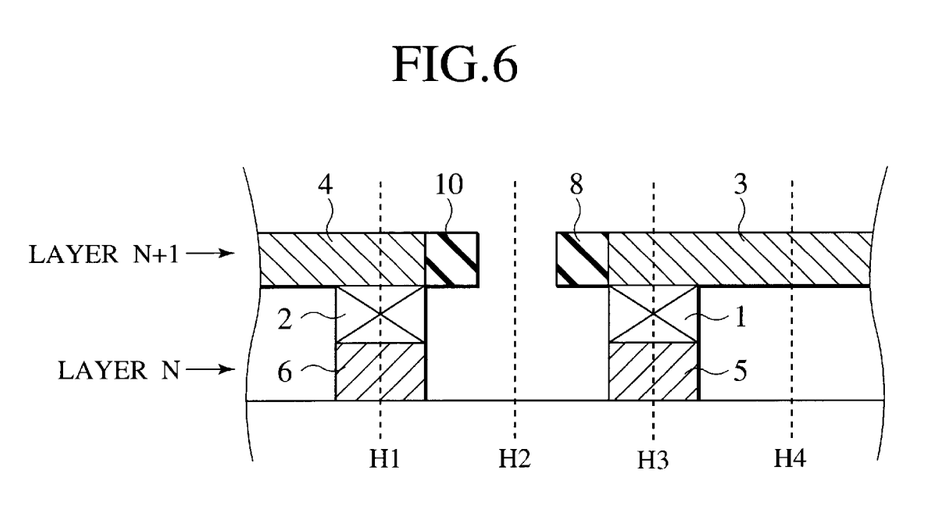
FIG. 6 is a sectional view taken along a grid line V2 of FIG. 5.

FIG. 6 is a sectional view taken along a grid line V2 of FIG. 5. The end of the main wire 3 in the layer N+1 is on the via-contact 1 that is in the layer N. Under the via-contact 1, there is the end of the main wire 5 that is in the layer N. The end of the main wire 4 in the layer N+1 is on the via-contact 2 that is in the layer N. Under the via-contact 2, there is the end of the main wire 6 that is in the layer N. The sectional view of FIG. 6 is in the wiring direction of the layer N+1, and therefore, shows that the extension 8 is extended from the end of the main wire 3 beyond the via-contact 1 and that the extension 10 is extended from the end of the main wire 4 beyond the via-contact 2.

Figure 7A:
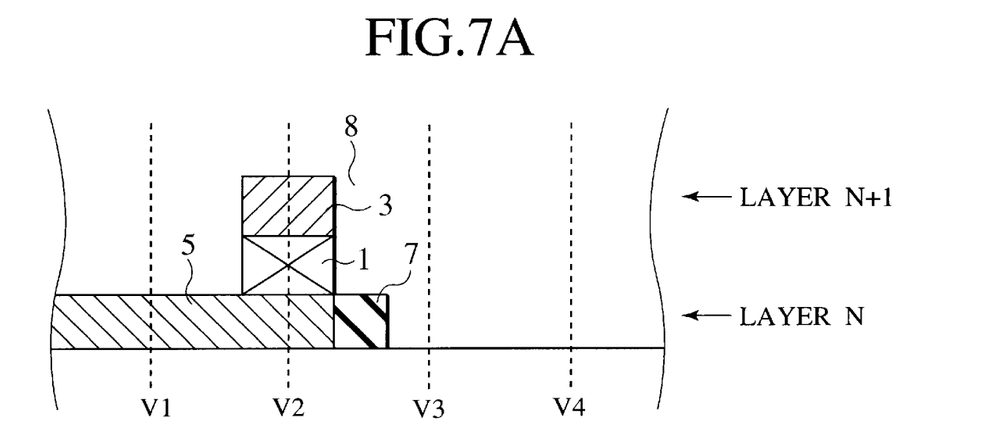
FIG. 7A is a sectional view taken along a grid line H3 of FIG. 5.
Figure 7B:
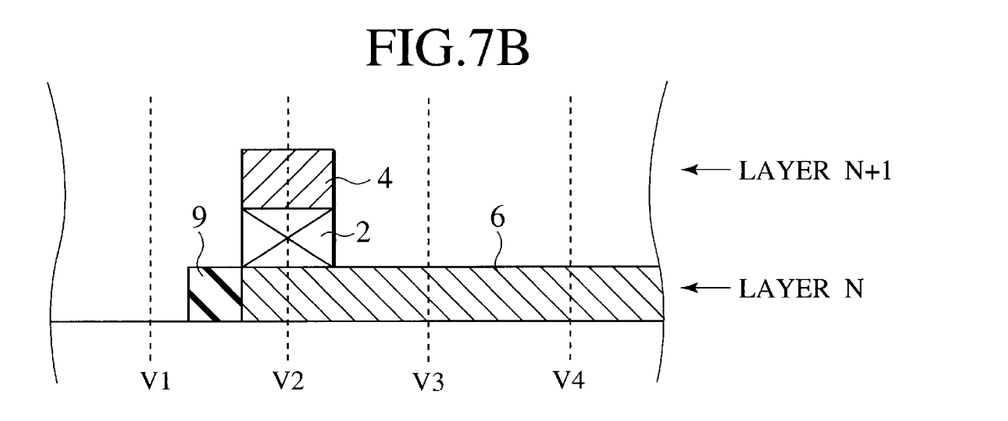
FIG. 7B is a sectional view taken along a grid line H1 of FIG. 5.

FIG. 7A is a sectional view taken along a grid line H3 of FIG. 5, and FIG. 7B is a sectional view taken along a grid line H1 of FIG. 5. These sectional views are in the wiring direction of the layer N, and therefore, show that the extension 7 is extended from the end of the main wire 5 beyond the via-contact 1 and that the extension 9 is extended from the end of the main wire 6 beyond the via-contact 2.

A method of designing a semiconductor device according to the first embodiment will be explained.

(1) Step S1 employs a standard LSI automatic layout tool to compactly arrange functional blocks and elements in a chip area without violating design rules. At this time, wiring spaces are secured among the functional blocks and elements so that the functional blocks and elements may be connected to one another through metal wires.

(2) Step S2 employs the automatic layout tool to arrange main wires and via-contacts in the wiring spaces so that main wires in layers N and N+1 are connected to each other through via-contacts in the layer N. These main wires serve to connect the functional blocks and elements to one another or transmit signals to and from I/O pads.

Metal wires of a standard LSI are longitudinally or laterally oriented layer by layer. Namely, each layer has a given orientation of wires, and therefore, once a layer is given, the orientation of wires in the given layer is automatically determined The via-contacts in the layer N arranged by the automatic layout tool connect the main wires in the layer N to the main wires in the layer N+1, and the orientations of these main wires are automatically determined. Accordingly, step S2 employs the automatic layout tool to arrange, together with the via-contacts in the layer N, extensions that extend in line with the main wires in the layers N and N+1. As a result, the metal wires provided with the extensions are prepared as shown in FIG. 5. Namely, step S2 arranges the main wires in the layers N and N+1 and the via-contacts in the layer N.

Figure 8:
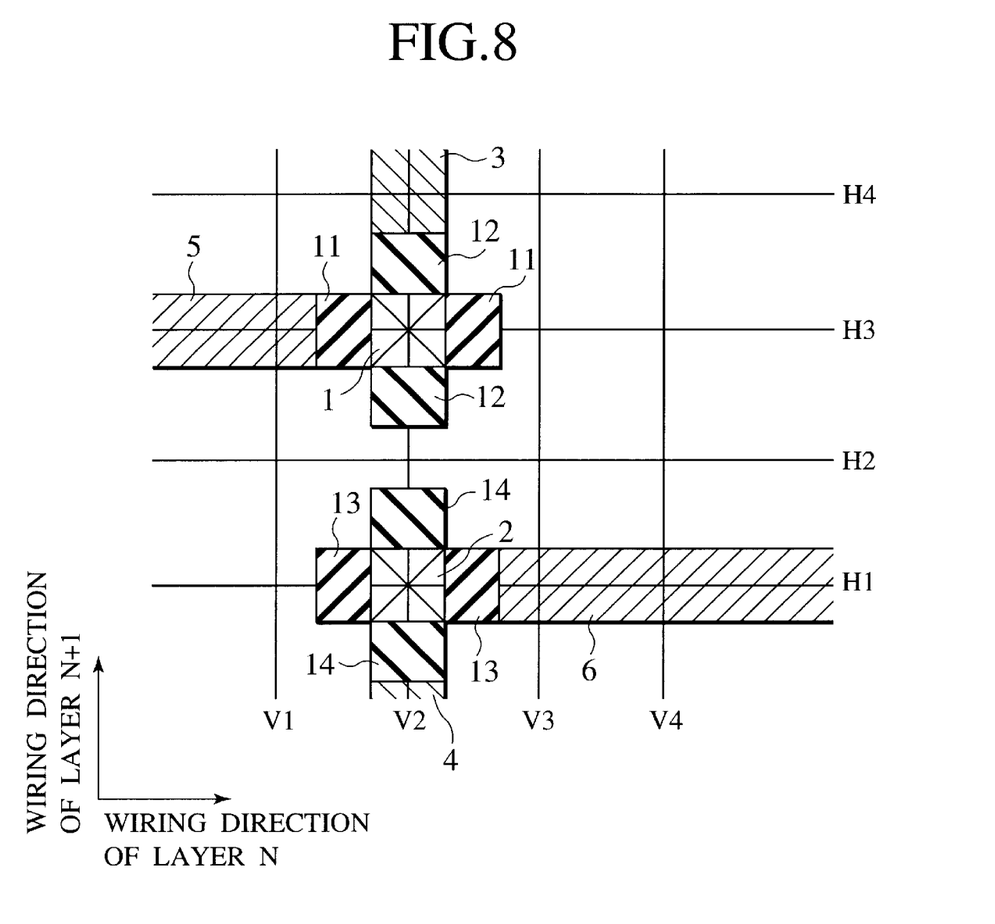
FIG. 8 is a plan view showing a method of designing a semiconductor device according to the first embodiment.

FIG. 8 is a plan view showing metal wires prepared according to the semiconductor device designing method of the present invention. In FIG. 8, via-contacts arranged in a layer N include:

(A) the via-contacts (1, 2) themselves to electrically connect main wires in the layer N to main wires in a layer N+1;

(B) an extension (12, 14) formed in the layer N+1 on and beyond each of the via-contacts and extended from an end of a corresponding one (3, 4) of the main wires of the layer N+1 in line with the main wire, the width of the extension being equal to or narrower than the width of the main wire; and (C) an extension (11, 13) formed in the layer N under and beyond each of the via-contacts and extended from an end of a corresponding one (5, 6) of the main wires of the layer N in line with the main wire, the width of the extension being equal to or narrower than the width of the main wire.

According to the first embodiment, the layer N includes the via-contacts 1 and 2. On the via-contact 1, the extension 12 of the layer N+1 extends from an end of the main wire 3 of the layer N+1 beyond the via-contact 1. Under the via-contact 1, the extension 11 of the layer N extends from an end of the main wire 5 of the layer N beyond the via-contact 1. On the via-contact 2, the extension 14 of the layer N+1 extends from an end of the main wire 4 of the layer N+1 beyond the via-contact 2. Under the via-contact 2, the extension 13 of the layer N extends from an end of the main wire 6 of the layer N beyond the via-contact 2. The ends of the main wires 3 and 5 are connected to the via-contact 1, and the ends of the main wires 4 and 6 are connected to the via-contact 2.

Figure 9:
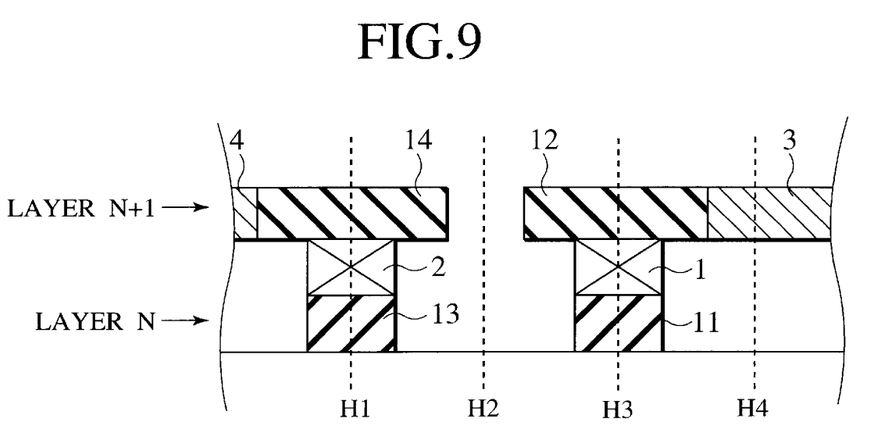
FIG. 9 is a sectional view taken along a grid line V2 of FIG. 8.

FIG. 9 is a sectional view taken along a grid line V2 of FIG. 8. In FIG. 9, the extension 12 in the layer N+1 is on the via-contact 1 of the layer N, and the extension 11 in the layer N is under the via-contact 1. The extension 14 in the layer N+1 is on the via-contact 2 of the layer N, and the extension 13 in the layer N is under the via-contact 2. Since the sectional view of FIG. 9 is in the wiring direction of the layer N+1, the extensions 12 and 14 are protruding from the via-contacts 1 and 2, and there are no protrusions from the extensions 11 and 13. The right protrusion of the extension 12 is in contact with the main wire 3, and the left protrusion of the extension 14 is in contact with the main wire 4. Consequently,. the structure of FIG. 9 is equivalent to that of FIG. 6.

Figure 10A:
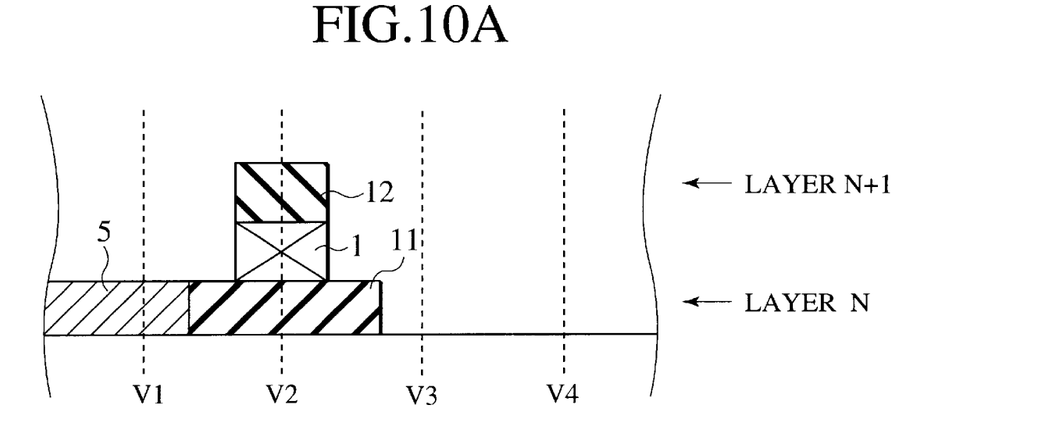
FIG. 10A is a sectional view taken along a grid line H3 of FIG. 8.
Figure 10B:
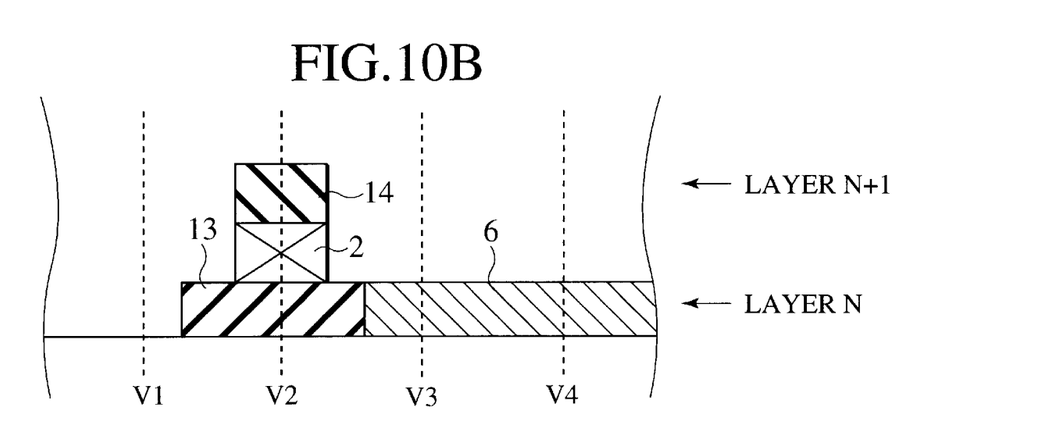
FIG. 10B is a sectional view taken along a grid line H1 of FIG. 8.

FIG. 10A is a sectional view taken along a grid line f of FIG. 8, and FIG. 10B is a sectional view taken along a grid line H1 of FIG. 8. In FIG. 1A, the extension 11 in the layer N is under the via-contact 1 of the layer N, and the extension 12 in the layer N+1 is on the via-contact 1. In FIG. 10B, the extension 13 in the layer N is under the via-contact 2 of the layer N, and the extension 14 in the layer N+1 is on the via-contact 2. The sectional views of FIGS. 10A and 10B are in the wiring direction of the layer N, and therefore, show that the extensions 11 and 13 are protruding from the via-contacts 1 and 2 and that there are no protrusions from the extensions 12 and 14. The left protrusion of the extension 11 is in contact with the main wire 5, and the right protrusion of the extension 13 is in contact with the main wire 6. Consequently, the structures of FIGS. 10A and 10B are equivalent to those of FIGS. 7A and 7B.

A program for executing the semiconductor designing method of the present invention may be stored in a computer readable recording medium. The recording medium is read by a computer system, which executes the program to achieve the semiconductor designing method of the present invention. The recording medium may be any medium capable of recording programs, such as a semiconductor memory, a magnetic disk an optical disk, a magneto-optic disk, or a magnetic tape.

Figure 11:
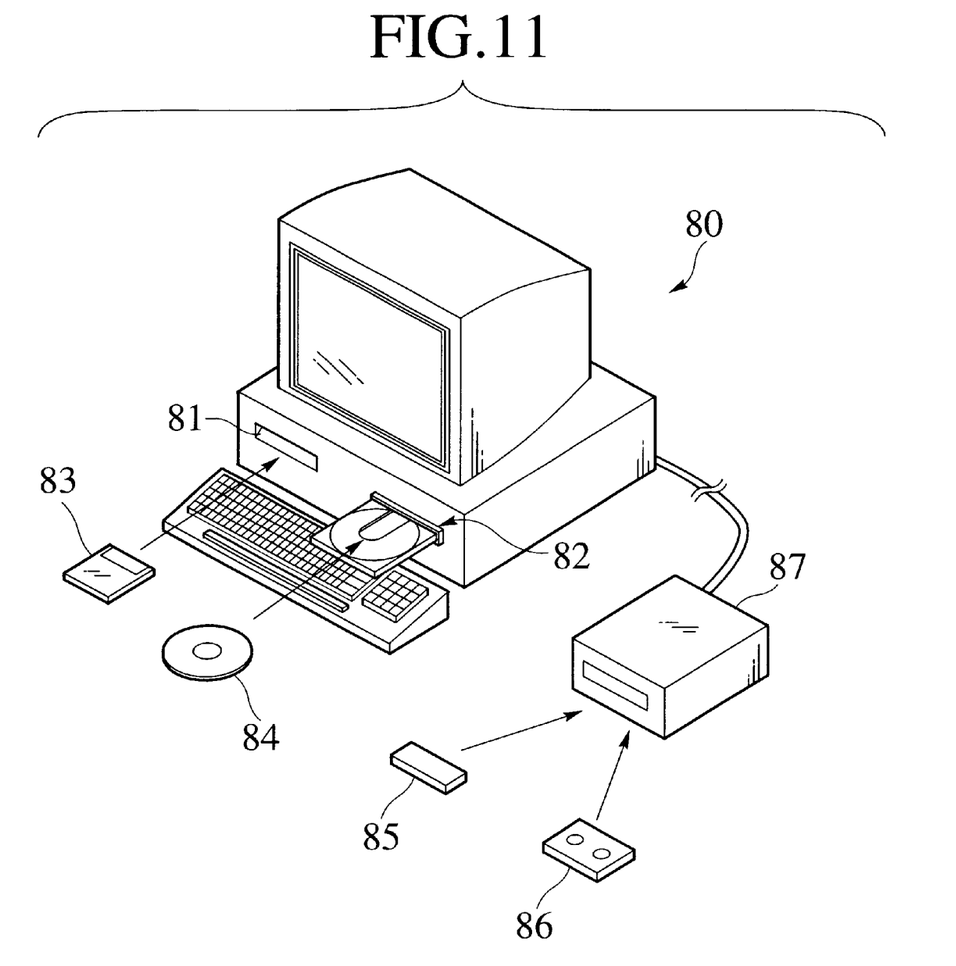
FIG. 11 is a perspective view showing a computer system for achieving the semiconductor device designing method of the first embodiment.

FIG. 11 is a perspective view showing a computer system 80 capable of reading a program from a recording medium, executing the program, and achieving the semiconductor designing method according to the program. The computer system 80 has a floppy disk drive 81 to receive a floppy disk 83, and a CD-ROM drive 82 to receive a CD-ROM 84. The floppy disk 83 and CD-ROM 84 store programs, which are read by and installed in the computer system 80. An external drive 87 may be connected to the computer system 80 to handle a semiconductor ROM 85 or a magnetic cassette tape 86, both storing programs.

According to the first embodiment, the extensions (7 to 10, or 11 to 14) are formed in layers N and N+1 and are extended from ends of the main wires (3 to 6), which are in the layers N and N+1, beyond the via-contacts (1 and 2) formed in the layer N. As a result, the optical proximity effect rounds only the extensions, and no roundness occurs on the ends of the main wires.

The extensions 8 and 10, or 12 and 14 formed in the layer N+1 protrude from the via-contacts 1 and 2 toward the grid line H2, and therefore, the main wires 5 and 6 must be arranged on the grid lines H3 and H1, respectively, with the grid line H2 interposing between them. Even so, the main wires 5 and 6 are not widened at the via-contacts 1 and 2, and therefore, other main wires may be arranged on the grid line H2 in the layer N. Similarly, other main wires may be arranged on the grid line H4 in the layer N.

Further, the main wires 3 and 4 are not widened at the via-contacts 1 and 2, and therefore, other main wires may be arranged in the layer N+1 on grid lines V1 and V3 that are adjacent to the grid line V2 on which the main wires 3 and 4 are arranged.

Since the extensions 7 to 10, or 11 to 14 protrude from the via-contacts 1 and 2, no via-contacts are allowed on three grid intersections V1–H1, V2–H2, and V3–H3. Since the extensions on the via-contacts extend only in the wiring directions, grid-intersections V1–H2, V3–H2, V1–H4, and V3–H4 that are obliquely adjacent to the grid intersections V2–H1 and V2–H3 where the via-contacts 1 and 2 are set may have other via-contacts.

In this way, the first embodiment forms extensions in line with main wires in each wiring layer of a semiconductor device. The extensions extend from ends of the main wires beyond via-contacts to which the main wires are connected. The width of each extension is equal to or narrower than the width of a corresponding main wire. The optical proximity effect only rounds the extensions so that the ends of the main wires may be left intact. This prevents contact defects and open defects between the main wires and the via-contacts. Each extension shows no widening around a corresponding via-contact, and therefore, other main wires or other via-contacts may be arranged in the vicinity of the via-contact without violating design rules. Consequently, the first embodiment is capable of densely arranging metal wires and via-contacts to realize a highly integrated wiring layout for a semiconductor device. The first embodiment may include data for extensions in data for via-contacts to be entered into an automatic layout tool, so that there is no necessity to provide a main wire with the extension as a supplementary fringe when preparing data to make a mask. This decreases the quantity of design pattern data, shortens a mask data preparation time, and reduces a semiconductor device development time.

Second embodiment

Figure 12:
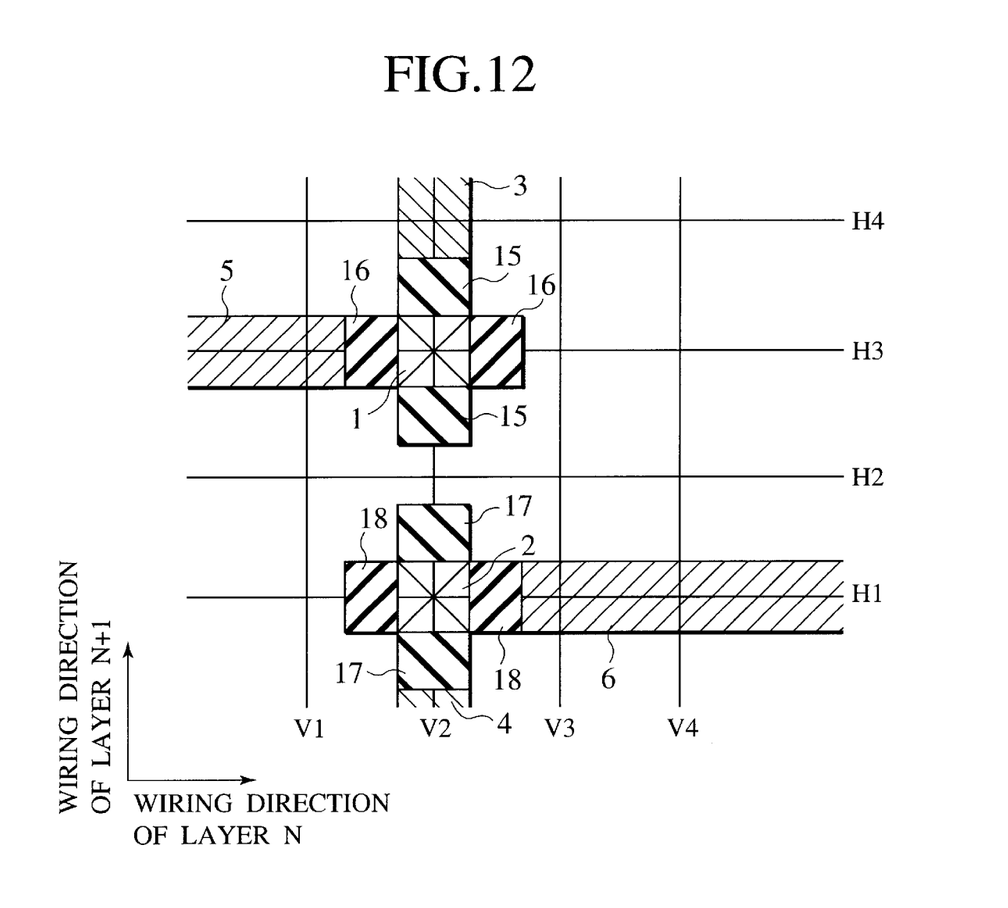
FIG. 12 is a plan view showing metal wires of a semiconductor device according to a second embodiment of the present invention.

Unlike the first embodiment that arranges extensions in line with main wires, the second embodiment arranges extensions orthogonally to main wires. FIG. 12 is a plan view showing metal wires of a semiconductor device according to the second embodiment The semiconductor device of the second embodiment has X wiring layers where "X" is a natural number and "N" is any natural number that satisfies 0<=N<=X−1. If N=0 then a layer N is a substrate and a layer N+1 is a first layer. Via-contacts that connect wires in a layer N to wires in a layer N+1 are in the layer N. The semiconductor device of the second embodiment has via-contacts (1, 2), main wires (3 to 6) having ends connected to the via-contacts, and extensions (15 to 18) orthogonally extending from the ends of the main wires beyond the via-contacts, the width of each extension being equal to or narrower than the width of a corresponding main wire.

The via-contacts 1 and 2 are formed in a layer N of the semiconductor device, the main wires 3 and 4 are formed in a layer N+1, and the main wires 5 and 6 are formed in the layer N. The via-contacts 1 and 2 and main wires 3 to 6 are the same as those of the first embodiment, and therefore, will not be explained in detail.

The extension 16 is formed in the layer N+1 and is in contact with an end of the main wire 3. The extension 18 is in the layer N+1 and is in contact with an end of the main wire 4. The extension 15 is in the layer N and is in contact with an end of the main wire 5. The extension 17 is in the layer N and is in contact with an end of the main wire 6. Although each end of the main wires is on a via-contact in FIG. 12, this does not limit the present invention. The main wires may have via-contacts in the middle thereof. Such middle via-contacts may have extensions that are orthogonal to the main wires. Although the extensions in FIG. 12 have each a quadrate plan shape, the plan shape thereof is optional, for example, a circle.

Figure 13:
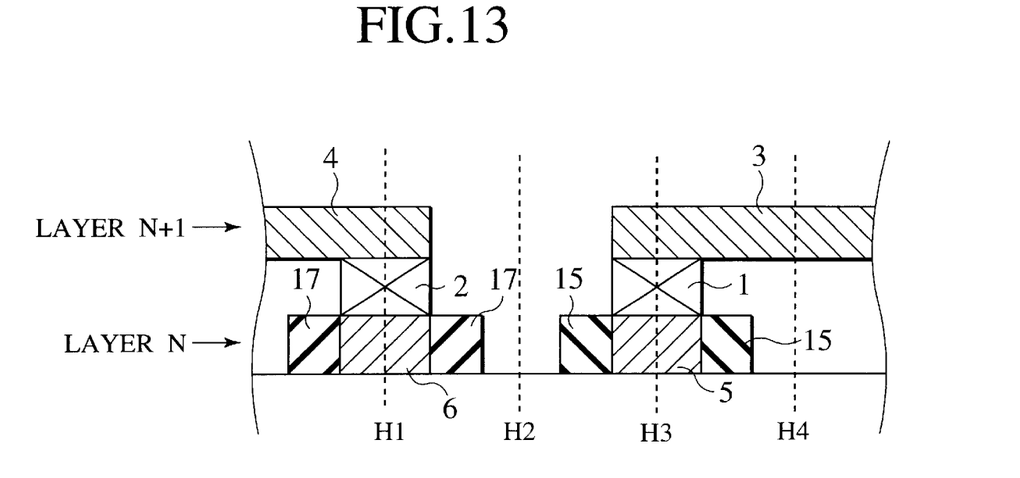
FIG. 13 is a sectional view taken along a grid line V2 of FIG. 12.
Figure 14A:
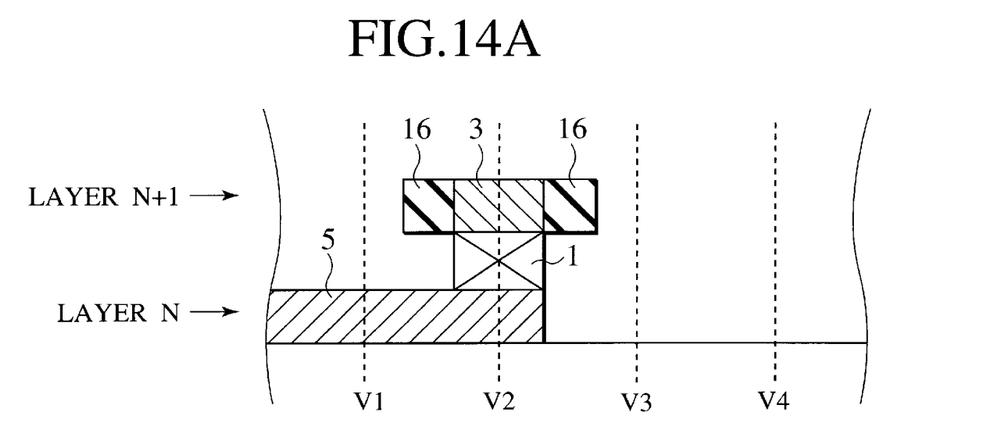
FIG. 14A is a sectional view taken along a grid line H3 of FIG. 12.
Figure 14B:
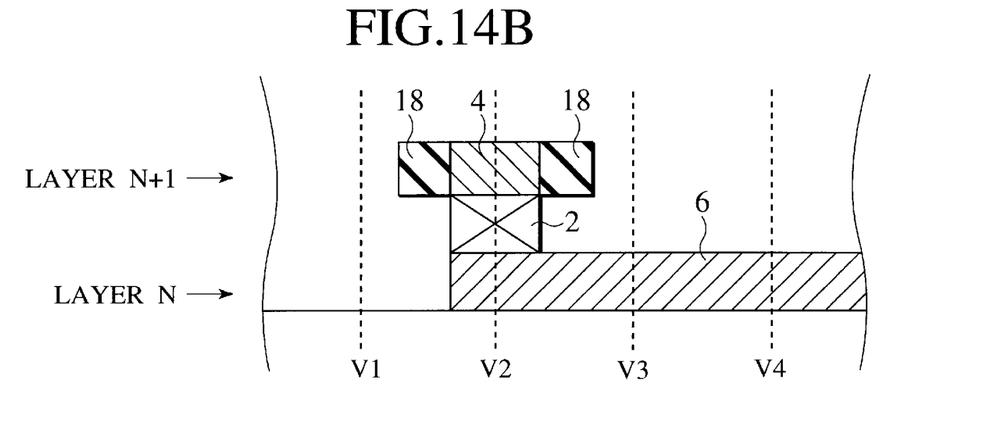
FIG. 14B is a sectional view taken along a grid line H1 of FIG. 12.

FIG. 13 is a sectional view taken along a grid line V2 of FIG. 12. The end of the main wire 3 in the layer N+1 is on the via-contact 1 that is in the layer N, and the end of the main wire 5 in the layer N is under the via-contact 1. The end of the main wire 4 in the layer N+1 is on the via-contact 2 that is in the layer N, and the end of the main wire 6 is under the via-contact 2. The grid line V2 is orthogonal to the wiring direction of the wiring layer N, and on the grid line V2, there are the via-contacts 1 and 2 where the ends of the main lines 5 and 6 are present In contact with the end of the main wire 5, the extension 15 in the layer N extends beyond the via-contact 1. In contact with the end of the main wire 6, the extension 17 extends beyond the via-contact 2. FIG. 14A is a sectional view taken along a grid line H3 of FIG. 12, and FIG. 14B is a sectional view taken along a grid line H1 of FIG. 12. The grid line H3 is orthogonal to the wiring direction of the wiring layer N+1, and on the grid line H3, there is the via-contact 1 that is in contact with the end of the main wire 3. In contact with the end of the main wire 3, the extension 16 extends beyond the via-contact 1. The grid line H1 is orthogonal to the wiring direction of the wiring layer N+1, and on the grid line H1, there is the via-contact 2 that is in contact with the end of the main wire 4. In contact with the end of the main wire 4, the extension 18 extends beyond the via-contact 2.

Data for the extensions 15 to 18 may be included in data for the via-contacts 1 and 2, so that an automatic layout tool may automatically design a semiconductor device having metal wires provided with the extensions 15 to 18. Namely, the automatic layout tool may automatically arrange the main wires 3 to 6 in layers N and N+1 and the via-contacts in the layer N. In FIG. 12, the via-contacts in the layer N include:

(A) the via-contacts (1, 2) themselves to electrically connect the main wires in the layer N to the main wires in the layer N+1;

(B) the extensions (16, 18) formed in the layer N+1 on and beyond the via-contacts in contact with the ends of the main wires (3, 4) of the layer N+1, respectively, and extended orthogonally to the main wires, the width of each extension being equal to or narrower than the width of the corresponding main wire; and (C) the extensions (15, 17) formed in the layer N under and beyond the via-contacts in contact with the ends of the main wires (5, 6) of the layer N, respectively, and extended orthogonally to the main wires, the width of each extension being equal to or narrower than the width of the corresponding main wire.

A program for designing the semiconductor device of the second embodiment may be stored in a computer readable recording medium, like the first embodiment The recording medium is read by a computer system, which executes the program to design the semiconductor device of the second embodiment. Such a computer system maybe the one shown in FIG. 11.

According to the second embodiment, extensions (15 to 18) are formed in layers N and N+1 of a semiconductor device and are orthogonally extended from the ends of main wires (3 to 6) formed in the layers N and N+1 beyond via-contacts (1 and 2) formed in the layer N. As a result, the optical proximity effect rounds only the extensions, and no roundness occurs on the ends of the main wires. This prevents contact defects or open defects between the via-contacts and the main wires. The second embodiment may include data for the extensions in data for the via-contacts to be entered into an automatic layout tool, so that there is no necessity to provide a main wire with the extension as a supplementary fringe when preparing data to make a mask. This decreases the quantity of design pattern data, shortens a mask data preparation time, and reduces a semiconductor device development time.

In summary, the present invention provides a highly integrated semiconductor device with minimized contact defects between metal wires and via-contacts, a method of designing such a semiconductor device, and a computer readable recording medium storing a program that achieves the semiconductor device designing method.

The present invention also provides a semiconductor device involving a short development time, a method of designing such a semiconductor device, and a recording medium storing a design program for designing such a semiconductor device.

What is claimed is:

1. A semiconductor device comprising:

a via-contact;

a main wire having an end connected to the via-contact; and an extension extended from the end of the main wire beyond the via-contact, the width of the extension being equal to or narrower than the width of the main wire, wherein the main wire is not widened at the via-contact, the extension is in line with the main wire, and the width of the via-contact is equal to the width of the main wire.

2. A semiconductor device comprising:

a via-contact;

a main wire having an end connected to the via-contact; and an extension extended from the end of the main wire beyond the via-contact, the width of the extension being equal to or narrower than the width of the main wire, wherein the main wire is not widened at the via-contact, the extension is orthogonal to the main wire, and the width of the via-contact is equal to the width of the main wire.

* * * * *